(12) United States Patent
Smith et al.

(10) Patent No.: US 7,733,254 B2
(45) Date of Patent: Jun. 8, 2010

(54) SAMPLE AND HOLD CIRCUIT FOR A CURRENT MODE PIPELINED ANALOG-TO-DIGITAL CONVERTER

(75) Inventors: Kent F. Smith, Holladay, UT (US); Daniel J. Black, Draper, UT (US); Steve R. Jacobs, Salt Lake City, UT (US)

(73) Assignee: Slicex, Inc., Sandy, UT (US)

( * ) Notice: Subject to any disclaimer, the term of this patent is extended or adjusted under 35 U.S.C. 154(b) by 0 days.

(21) Appl. No.: 12/147,254

(22) Filed: Jun. 26, 2008

(65) Prior Publication Data

US 2009/0002215 A1     Jan. 1, 2009

Related U.S. Application Data

(60) Provisional application No. 60/946,901, filed on Jun. 28, 2007.

(51) Int. Cl.
*H03M 1/38*     (2006.01)
*H03M 1/00*     (2006.01)

(52) U.S. Cl. ................. 341/135; 341/155; 341/156; 341/161

(58) Field of Classification Search ............. 341/155, 341/156, 161, 135
See application file for complete search history.

(56) References Cited

U.S. PATENT DOCUMENTS

| | | | |
|---|---|---|---|
| 5,043,732 A | 8/1991 | Robertson | |
| 5,990,820 A | 11/1999 | Tan | |
| 6,313,780 B1 | 11/2001 | Hughes | |
| 7,002,505 B2 * | 2/2006 | Hughes | ............ 341/161 |
| 2003/0076253 A1 * | 4/2003 | Roovers et al. | ............ 341/156 |
| 2008/0117092 A1 * | 5/2008 | Wolf et al. | ............ 341/161 |

OTHER PUBLICATIONS

Switched-Current Circuits in Digital CMOS Technology with Low Charge-Injection Errors; Ganesh Kumar Balachandran and Phillip E. Allen, Fellow, IEEE; IEEE Journal of Solid-State Circuits, Vol. 37, No. 10, October 2002.
A CMOS Transistor-Only 8-b 4.5-Ms/s Pipelined Analog-to-Digital Converter Using Fully Differential Current-Mode Circuit Techniques; Chung-Yu Wu, Member, IEEE, Chih-Cheng Chen, Student Member, IEEE, and Jyh-Jer Cho; IEEE Journal of Solid-State Circuits, vol. 30, No. 5, May 1995.

* cited by examiner

*Primary Examiner*—Jean B Jeanglaude
(74) *Attorney, Agent, or Firm*—Steven L. Nichols; Vancott, Bagley, Corwall & McCarthy (57) ABSTRACT

A pipelined current mode analog-to-digital converter, including: a plurality of stages each having a first sample and hold circuit configured to receive an analog signal having a current; the sample and hold circuit having at least first and second outputs; the first output having a current from a current copier configured to copy the analog signal; the second output having a current from a current mirror configured to mirror the analog signal; a current mode analog-to-digital converter configured to create a digital signal from the second output, the second output being connected to an input of the analog-to-digital converter; and a current mode digital-to-analog converter configured to convert the digital signal back to an analog signal, wherein an output of the digital-to-analog converter is subtracted from the first output of the sample and hold circuit.

20 Claims, 8 Drawing Sheets

SAMPLE AND HOLD CIRCUIT FOR A CURRENT MODE PIPELINED ANALOG-TO-DIGITAL CONVERTER

CROSS-REFERENCE TO RELATED APPLICATION

The present application claims priority under 35 U.S.C. §119(e) from previous U.S. Provisional Patent Application No. 60/946,901 by Kent F. Smith et al., entitled "Current Mode Pipelined Analog-to-Digital Converter" filed Jun. 28, 2007, which provisional application is hereby incorporated by reference in its entirety.

BACKGROUND

Historically, engineers have been trained to design circuits in terms of voltage. For example, when performing integrated circuit analysis, designers typically focus on the voltage change at the output of the circuit that occurs as a result of a voltage change that occurs at the input of the circuit. Circuit simulators also follow this approach by constructing matrices of nodes to solve for node voltages. On the test bench, voltage sources are used to operate circuits under test and test equipment is configured to measure voltage.

Over the years, the density of integrated circuits has increased rapidly as component sizes have become smaller. With each reduction in component size, a corresponding reduction in optimal operating voltages occurs. These decreases in operating voltages have required reductions in threshold voltages in order to maintain desired noise margins. Analog circuits, particularly analog-to-digital converters (ADCs) have suffered from this reduction, as they are typically designed with higher voltage transistors and operating voltages than are available to digital designers.

In a typical voltage mode ADC, the voltage being sampled is stored on a capacitor. It can be shown that the minimum size of the capacitor storing the voltage must be $>kT/(V_n^2)$, where k is Boltzman's constant, T is temperature in Kelvin, and $V_n$ is the size of the largest noise signal, usually less than ¼ of the ADC's least significant bit (LSB), that can be tolerated to give a low probability of error. As the operating voltage is reduced due to newer processes, the minimum capacitor size increases. This increases both the size of the circuit and the power used.

The accuracy of a voltage mode circuit, including a voltage mode ADC, is determined by the size of the capacitance used to store the voltage. The speed of a voltage mode circuit is consequently affected by circuit capacitance and parasitic capacitance. The nodes of a voltage mode circuit must change voltage during operation of the circuit over a range that is often approximately the entire voltage range of the power supply voltage. Changing to a smaller geometry process increases parasitic capacitances, and due to the smaller voltage swing, larger circuit capacitances must be used, thereby requiring more power to compensate for the reduction in noise margins.

SUMMARY

A pipelined current mode analog-to-digital converter, including: a plurality of stages each having a first sample and hold circuit configured to receive an analog signal having a current; the sample and hold circuit having at least first and second outputs; the first output having a current from a current copier configured to copy the analog signal; the second output having a current from a current mirror configured to mirror the analog signal; a current mode analog-to-digital converter configured to create a digital signal from the second output, the second output being connected to an input of the analog-to-digital converter; and a current mode digital-to-analog converter configured to convert the digital signal back to an analog signal, wherein an output of the digital-to-analog converter is subtracted from the first output of the sample and hold circuit.

BRIEF DESCRIPTION OF THE DRAWINGS

The accompanying drawings illustrate various embodiments of the principles described herein and are a part of the specification. The illustrated embodiments are merely examples and do not limit the scope of the claims.

Throughout the drawings, identical reference numbers designate similar, but not necessarily identical, elements.

DETAILED DESCRIPTION

The present specification discloses systems and methods related to the conversion of analog signals to digital signals through a pipelined current mode analog-to-digital converter (ADC) system, particularly in relation to sample and hold (S/H) circuits. The use of pipelined current mode ADCs is advantageous in many systems and often results in reduced power consumption, fewer components, lower cost, faster operating speeds, simplified layout, and higher accuracy.

As used in the present specification and in the appended claims, the term "current mode" refers to circuits and electrical systems that focus on current values and changes in current values through branches and components of the systems due to current changes at the input(s) of the systems, rather than voltage values and changes at nodes (or intersections) of the systems due to voltage changes at the input(s).

As used in the present specification and in the appended claims, the term "NMOS" refers to an n-channel metal-oxide-semiconductor field-effect transistor (MOSFET), and the term "PMOS" refers to a p-channel MOSFET. An NMOS device is activated, allowing current to flow between the drain and the source, when a high input is applied to its gate in relation to its source, and a PMOS device is activated when a low input is applied to its gate in relation to its source. Combinations of NMOS and PMOS devices may be used in implementing logic gates, digital circuitry, and other electronic systems.

In the following description, for purposes of explanation, numerous specific details are set forth in order to provide a thorough understanding of the present systems and methods. It will be apparent, however, to one skilled in the art that the present systems and methods may be practiced without these specific details. Reference in the specification to "an embodiment," "an example" or similar language means that a particular feature, structure, or characteristic described in connection with the embodiment or example is included in at least that one embodiment, but not necessarily in other embodiments. The various instances of the phrase "in one embodiment" or similar phrases in various places in the specification are not necessarily all referring to the same embodiment.

In some examples, as will be described in more detail below, a current mode ADC operates, for example, by comparing the current of an input signal to one or more reference currents to create a digital representation of the incoming signal. The ADC described herein may be used in a variety of applications including but not limited to, battery level measurement (metering), communications, imaging, measurement, control systems, sensors, etc.

As described above, traditional circuits are designed in terms of voltage. For example, in the field of analog-to-digital conversion, voltage mode ADCs compare the voltage of an input signal to a number of reference voltages to determine which reference voltage is closest to the voltage of the input signal. A digital representation of the input signal may then be created based on a series of such voltage comparisons.

In contrast, there are several advantages to designing circuits in terms of current. As will be described in more detail below, in current mode ADCs, for example, the current of an input signal may be compared to a number of current references to determine which reference current is closest to the current of the input signal. A digital representation of the input signal may then be created based on a series of such current comparisons.

One of the many advantages of this approach is that because current sources are used instead of voltage references, operational voltage becomes far less of a limiting factor. By allowing lower operating voltages to be used, the ADC can take better advantage of the increases in modern integrated circuit density. Also, since the voltages at nodes in a current mode circuit change very little, circuit and parasitic capacitances have much less effect on the speed of the circuit.

In using current mode ADCs, however, it becomes necessary for the input to the ADCs be represented with a current value. One way of doing this is to sample and hold the analog input signal in current mode such that there is no need for a voltage-to-current converter in every stage of the system, rather the S/H circuit outputs an analog signal as a current rather than a voltage.

Figure 1:
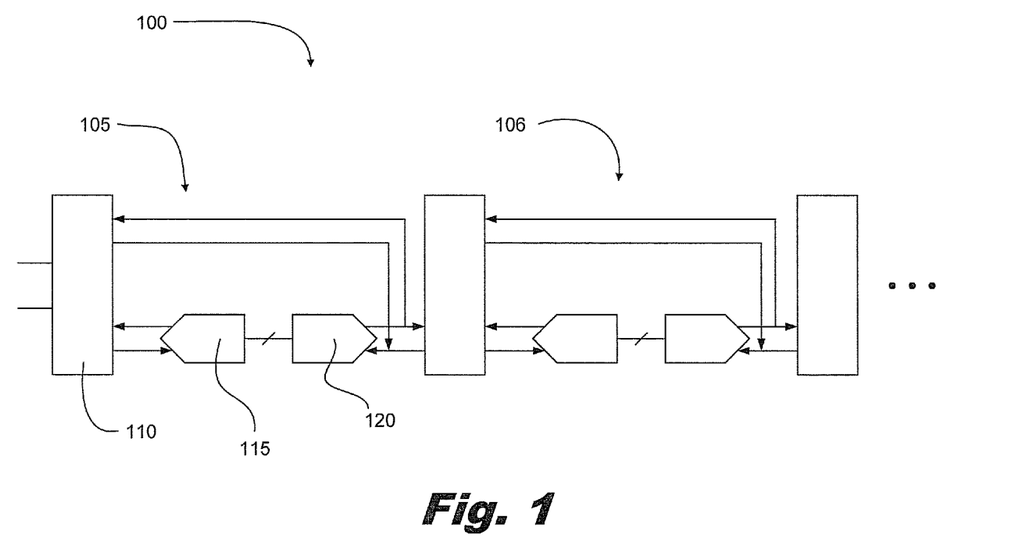
FIG. 1 is a block diagram of an illustrative embodiment of a number of stages in a pipelined analog-to-digital converter, according to principles described herein.

FIG. 1 illustrates an embodiment of a current mode pipelined ADC system (100). The system (100) includes a number of stages (105, 106) pipelined or connected in series. Each stage (105) comprises at least a S/H circuit (110), an ADC (115), and a digital-to-analog converter (DAC, 120), all configured to operate in current mode. The ADC (115) may be a flash ADC. The first stage (105) of the system (100) may comprise a voltage-to-current converter such that analog signals having a representation in terms of voltage may be referenced in terms of current, such that it may be used in the current mode components of the system. In some embodiments, the voltage-to-current converter may be configured to act as the S/H circuit (110). In other words, the voltage-to-current converter may be configured to sample the analog input signal and hold the value until it has been processed by the first stage (105). In other embodiments, the signal may already be represented in terms of current such that no voltage-to-current converter is needed.

The S/H circuit (110) receives an analog signal and samples the current value of the signal. The S/H circuit (110) then holds the sampled signal for a period of time while the rest of the first stage (105) performs functions, such as the flash ADC (115) converting the analog signal to a digital signal and outputting the digital signal, and the DAC (120) converting the digital signal back to an analog signal. After the first stage (105) is finished processing the signal, the DAC (120) outputs a signal which is then subtracted from the signal held by the S/H circuit (110). The current value of the analog output of the DAC (120) is typically very small, though it may have any value depending on the application.

Because the system (100) is a current mode system, the output of the DAC (120) may be subtracted directly from the signal being held by the S/H circuit (110) without a summing block or additional components. The subtracted signal, referred to as a residue signal, is sent to the S/H circuit (110) of the second stage (106) to be processed further. The second stage (106) is designed to further narrow the parameters in which the signal is processed in order to process more bits of the signal. Additional stages may be configured to even further process the signal. Theoretically it is possible to continue processing the signal an infinite number of times, though is not generally attainable in practice because signal levels become increasingly difficult to process as the parameters narrow.

Also, because the pipelined ADCs are current mode ADCs, no amplification of the residual current is needed prior to being input into the S/H circuit (110) of the second stage (106) because the current mode ADCs may be configured to be able to process very low amplitude current signals. Additionally, the S/H circuits (110) may also be capable of sampling and holding small current signals.

The current mode pipelined ADC system may be capable of processing any number of bits needed by each particular application. For example, the ADC and DAC in each stage may be a 4-bit flash ADC and a 4-bit DAC, respectively.

Figure 2:
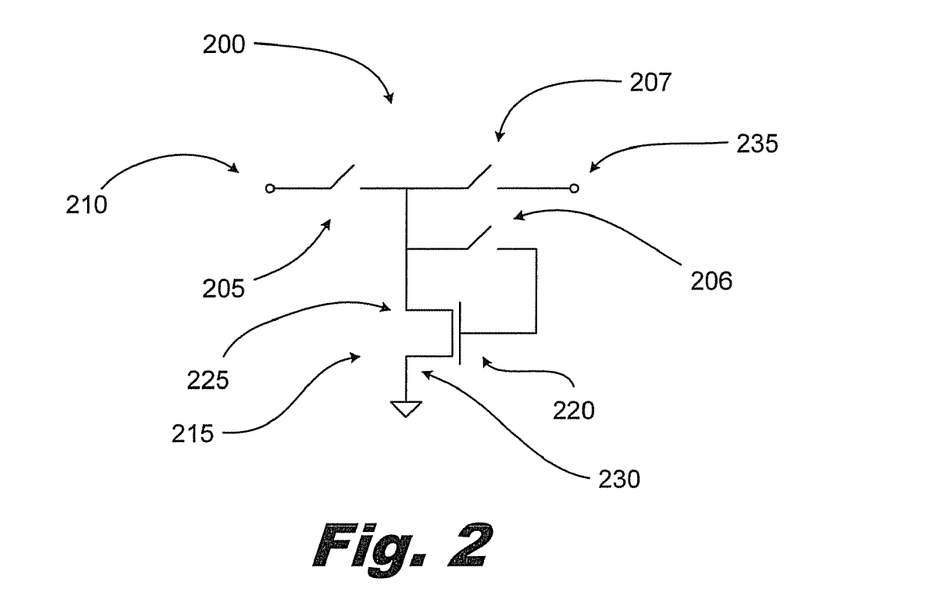
FIG. 2 is a schematic diagram of an illustrative embodiment of a current copier sample and hold circuit, according to principles described herein.
Figure 3:
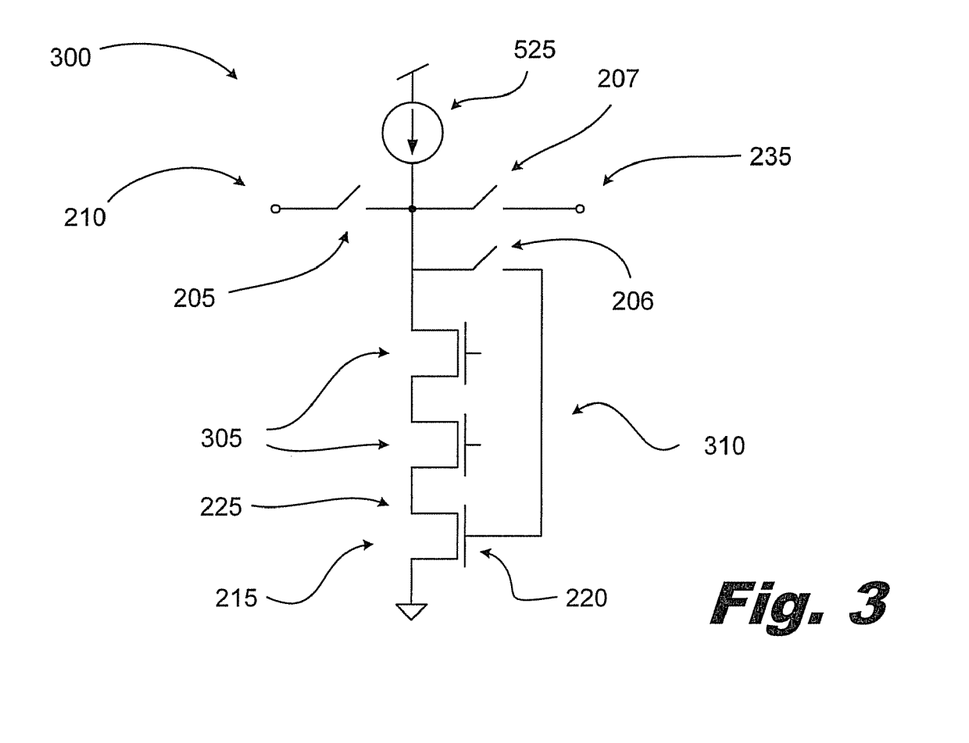
FIG. 3 is a schematic diagram of an illustrative embodiment of a current copier sample and hold circuit, according to principles described herein.

FIGS. 2 and 3 illustrate possible embodiments of current mode S/H circuits known in the art. Current mode S/H circuits such as these are generally known as current copiers because the circuits are capable of sampling an input and copying the current of that input to an output. The S/H circuit (200) of FIG. 2 has first, second, and third switches (205, 206, 207). When the first and second switches (205, 206) are closed, a signal from the input (210) to the circuit (200) is introduced into the circuit (200). The circuit (200) has an NMOS transistor having a gate (220) connected to the input (210) in addition to the transistor drain (225). This is commonly known in the art as a diode connected transistor (215). Because the two terminals are connected to the input (210), the transistor (215) begins to conduct the input signal between the drain (225) and the source (230). Also, because the drain (225) and gate (220) are connected, the circuit (200) may be able to set the gate voltage such that the transistor (215) conducts a current value equal to the input signal.

After the transistor (215) begins conducting the input signal, the first and second switches (205, 206) may be opened and the third switch (207) may be closed appropriately such that the transistor (215) draws current from an output (235) of the S/H circuit (200). The current that the transistor (215) draws from the output (235) is substantially equal to the current of the input signal. Aspects which may affect the current value drawn from the output (235) are the voltage at the transistor gate (220), the impedance of the transistor (215), the load impedance, the input impedance, the charge injection from the switches (205, 206, 207), and leakage currents, in addition to other characteristics of the S/H circuit (200) or connected components.

The current copier may also include a bias current source (525) connected to the S/H circuit (200) between the first and second switches (205, 206). The bias current source may provide more accuracy for the current copier and may help prevent errors from occurring when opening and closing switches when performing sampling and holding processes. In embodiments including such a bias current source, the current flowing through the diode connected transistor (215) during sampling is equal to the input current plus the bias current. As the S/H circuit (200) changes to holding the input signal, the bias current source is still connected to the signal pathway and continues to supply current to the diode connected transistor (215). Because the bias current continues to supply current, the diode connected transistor draws a current from the output equal to the current of the input signal so that the current flowing through the diode connected transistor (215) does not change. Ideally, the ratio of the impedance of the current source in parallel with the diode connected transistor (215) to the output impedance is high enough to prevent changes in the output voltage level.

The illustrative embodiment in FIG. 3 shows a slightly improved S/H circuit (300). The S/H circuit (300) may include a number of cascode devices (305) such as additional transistors in series with the diode connected transistor (215) that may increase the impedance of the diode connected transistor loop (310). The cascode devices (305) are within the diode connected transistor loop (310) such that if the third switch is open (207), the cascode devices (305) are not in operation and do not affect the rest of the circuit (300). While the drain (225) of the diode connected transistor (215) in the current embodiment is not connected directly to the gate (220), the additional transistors have a bias voltage which may turn them on independently of the rest of the circuit (300). The result of including the cascode devices (305) is a higher overall impedance of the transistor loop (310) in relation to the input impedance when sampling, or the impedance ratio between the impedance of the transistor loop (310) and the load impedance when holding. A higher impedance ratio between the transistor loop (310) and the load impedance may help maintain the voltage at the output (235) at a level in order to allow the current to be correctly copied from the input (210) to the output (235).

Figure 4:
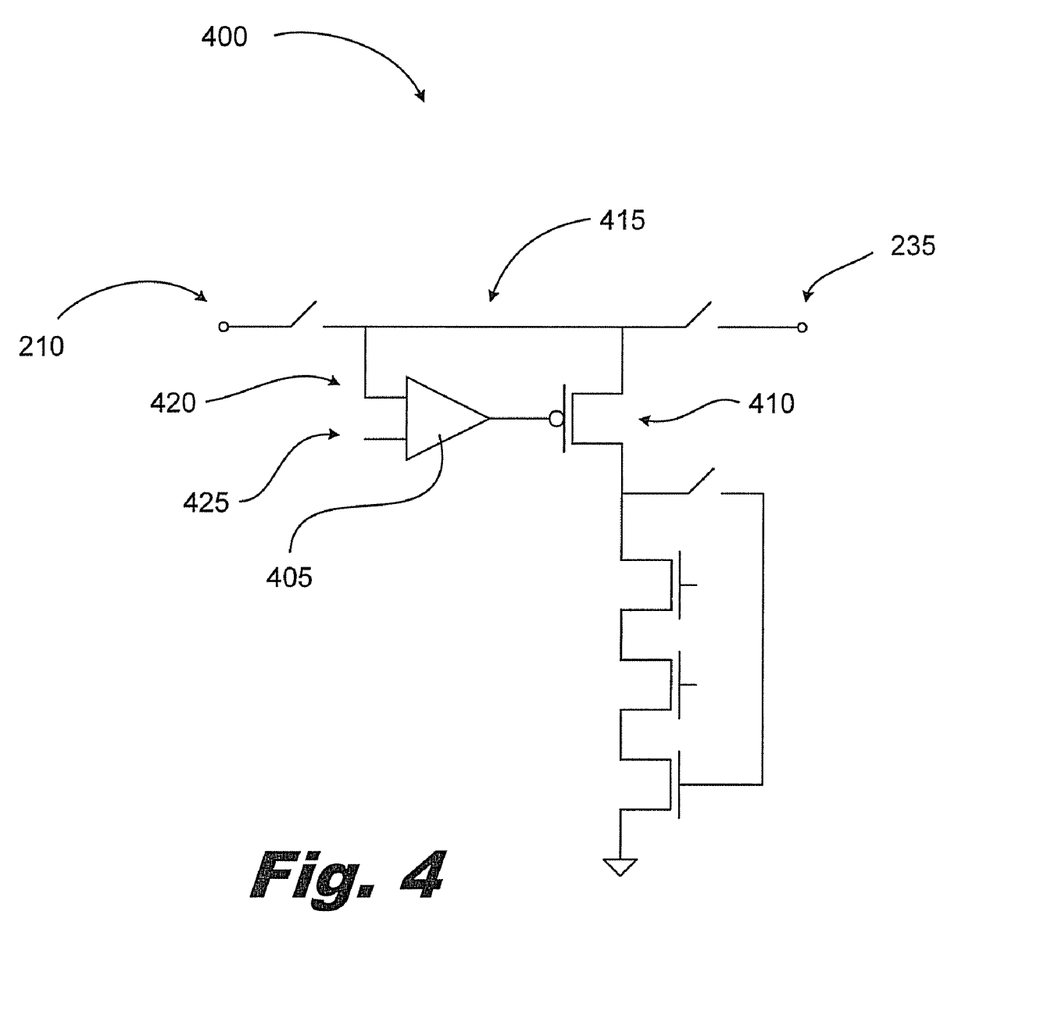
FIG. 4 is a schematic diagram of an illustrative embodiment of a current copier sample and hold circuit, according to principles described herein.

FIG. 4 shows an illustrative embodiment of an improved current copier S/H circuit (400) including an operational amplifier (405) with its output connected to the gate of a PMOS transistor (410). Changes in voltage at the output (235) while sampling and holding can have a detrimental effect on the accuracy of the current copier. Consequently, it is desirable to have a means of maintaining the voltage at the output (235) at a fixed value throughout the sampling and holding process.

A feedback loop (415) to a first input (420) of the amplifier (405) is connected to a source of the PMOS transistor (410). A reference voltage is applied to a second input (425) of the amplifier (405). In this configuration, the amplifier (405) forces the voltage at the first input (420), which is connected to both the S/H circuit input (210) and output (235), to be a constant voltage. Thus, the charge injection of the switches (205, 206, 207) may be constant independent of the current of the input signal, and the input signal may be accurately copied to the output when the S/H circuit (400) is holding the signal. This embodiment is a single-ended circuit having only one input (210) and one output (235).

Figure 5:
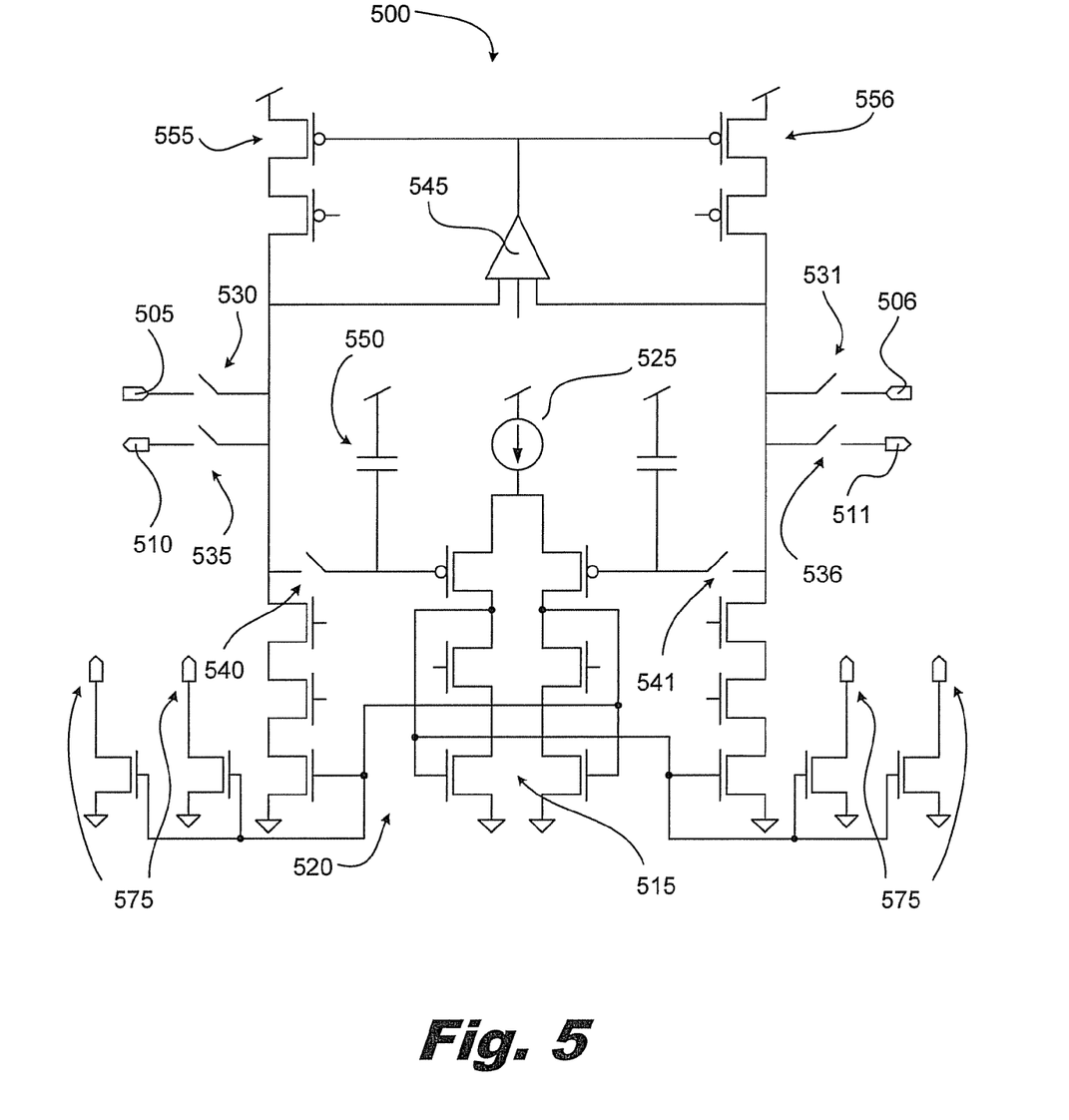
FIG. 5 is a schematic diagram of an illustrative embodiment of a current copier sample and hold circuit, according to principles described herein.

The accuracy of the current copier may be improved over the one-ended circuit previously described by making the S/H circuit (500) fully differential, as illustrated in the embodiment of FIG. 5. The S/H circuit (500) may have first and second inputs (505, 506) and first and second differential outputs (510, 511) which are current copier outputs. The first input (505) and first differential output (510) are connected such that they have an equal voltage, and the second input (506) and second differential output (511) are connected such they also have an equal voltage. The differential circuit includes a crossover (515) and may include a number of current mirrors (520). A bias current source (525) is connected to the S/H circuit (500) in order to provide a bias current for the inputs (505, 506) and outputs (510, 511). The S/H circuit (500) may be designed to recognize changes in signal currents such that the circuit (500) may make adjustments accordingly. The S/H circuit (500) may be designed to operate with a wide range of frequencies, anywhere between about 20-500 MHz. In some embodiments, the S/H circuit (500) may be designed to operate with frequencies of approximately 150-200 MHz.

When the S/H circuit (500) is sampling, first and second switches (530, 531) at the inputs (505, 506) along with third and fourth switches (535, 536) are closed such that the current mirrors (520) conduct current. The bias current source (525) also provides current for the circuit (500). When the first, second, third, and fourth switches (530, 531, 535, 536) are opened, fifth and sixth switches (540, 541) are closed such that current may be drawn from the outputs (510, 511) and the S/H circuit (500) is placed in a holding state.

The S/H circuit (500) also has a common mode amplifier (CMA, 545), which may help maintain the voltages at both inputs (505, 506) at a generally equal value irrespective of the current values of both input signals. While it may be difficult to keep the voltage values at the inputs continuously equal, the CMA (545) may maintain the voltages at or near an average value, as determined by the reference voltage input to the common mode amplifier.

As discussed previously, the circuit may also include cascode devices (305) for increasing the impedance of the current mirrors (520) or of diode connected transistor loops. The circuit may also include capacitors (550), which may be used to reduce system noise and help reduce stabilizing time when sampling and holding a signal, which may be particularly helpful when dealing with small signal values.

The S/H circuit may also include a number of additional outputs (575) that are scaled up or down from the input. The scaling may be accomplished by current mirrors having devices that are scaled appropriately in order to achieve the desired output current range. These outputs (575) may be connected to the flash ADC (115), or used as a current output for testing or other purposes. The DAC output is then subtracted from the non-scaled outputs (510, 511) of the S/H circuit (500) to achieve the residue signal. The accuracy and signal to noise requirements of subsequent stages in the pipelined ADC (100) may not be as high as required by the first stage (105). The combination of current mirror outputs and current copier outputs as described in the current embodiment is particularly advantageous as described in FIG. 9 because it allows a plurality of S/H circuits to be used in a pipelined ADC.

Figure 6:
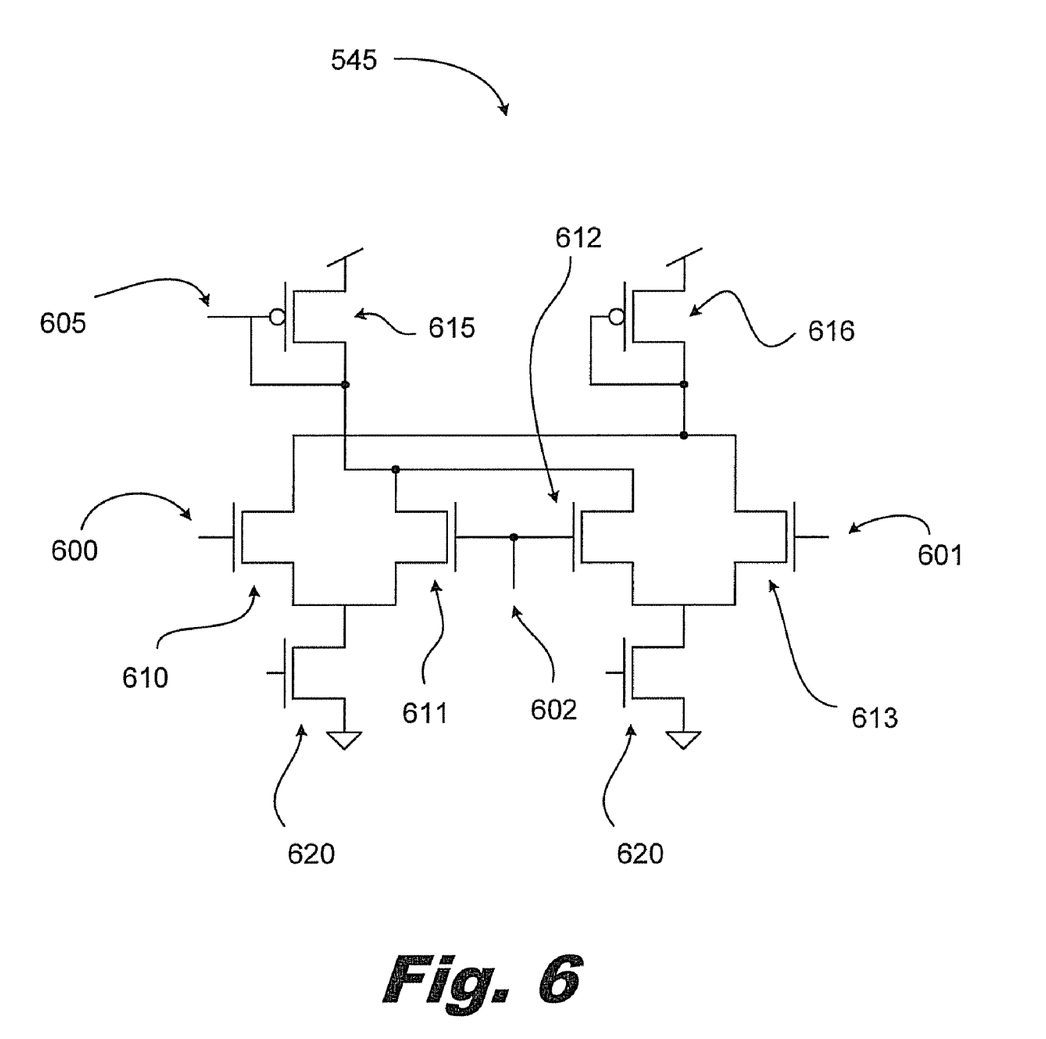
FIG. 6 is a schematic diagram of an illustrative embodiment of a common mode amplifier, according to principles described herein.

FIG. 6 shows an exemplary CMA (545). The CMA (545) has first, second, and third inputs (600, 601, 602), and an output for common mode feedback (CMFB, 605). The first and second inputs (600, 601) are connected to first and second NMOS transistors (610, 613). The third input (602) is a reference voltage connected to third and fourth NMOS transistors (611, 612). The CMFB output (605) is connected to a first PMOS transistor (615), which is a diode connected transistor. Current drawn from the first PMOS transistor (615) flows through the third and fourth NMOS transistors (611, 612) and current drawn from a second PMOS transistor (616), also a diode connected transistor, flows through the first and second NMOS transistors (610, 613). The CMA has additional transistors (620) that may have a constant gate voltage. Ideally, equal current flows from both PMOS transistors (615, 616) and through the additional transistors (620) in the CMA (545). In order to achieve this result, each component of the CMA (545) is matched with the other similar components such that they have equal electrical characteristics. However, it may be difficult to match the components exactly, so some variances may be expected.

Because the CMFB output (605) is a single-ended output at the gate of the first PMOS transistor (615) in the CMA (545) that is connected to two different PMOS transistors (555, 556) in the S/H circuit, referring back to FIG. 5, the first and second inputs (600, 601) to the CMA (545) may be regulated according to the reference voltage of the third input (602). Best current matching for the S/H circuit (500) may occur when the CMA (545) reference voltage is equal to the average of the first and second CMA input voltages (600, 601). The voltages at the first and second CMA inputs (600, 601) are equal to the voltages at the first and second S/H circuit inputs (505, 506), respectively, because they share the same nodes in this configuration. The S/H circuit (500) may include additional transistors or other components which may not substantially alter the operation of the circuit, but which may separate the S/H circuit inputs (505, 506) from the CMA inputs (600, 601) and set them at different voltages, while still being able to hold the S/H circuit outputs (510, 511) at a generally constant voltage.

Figure 7:
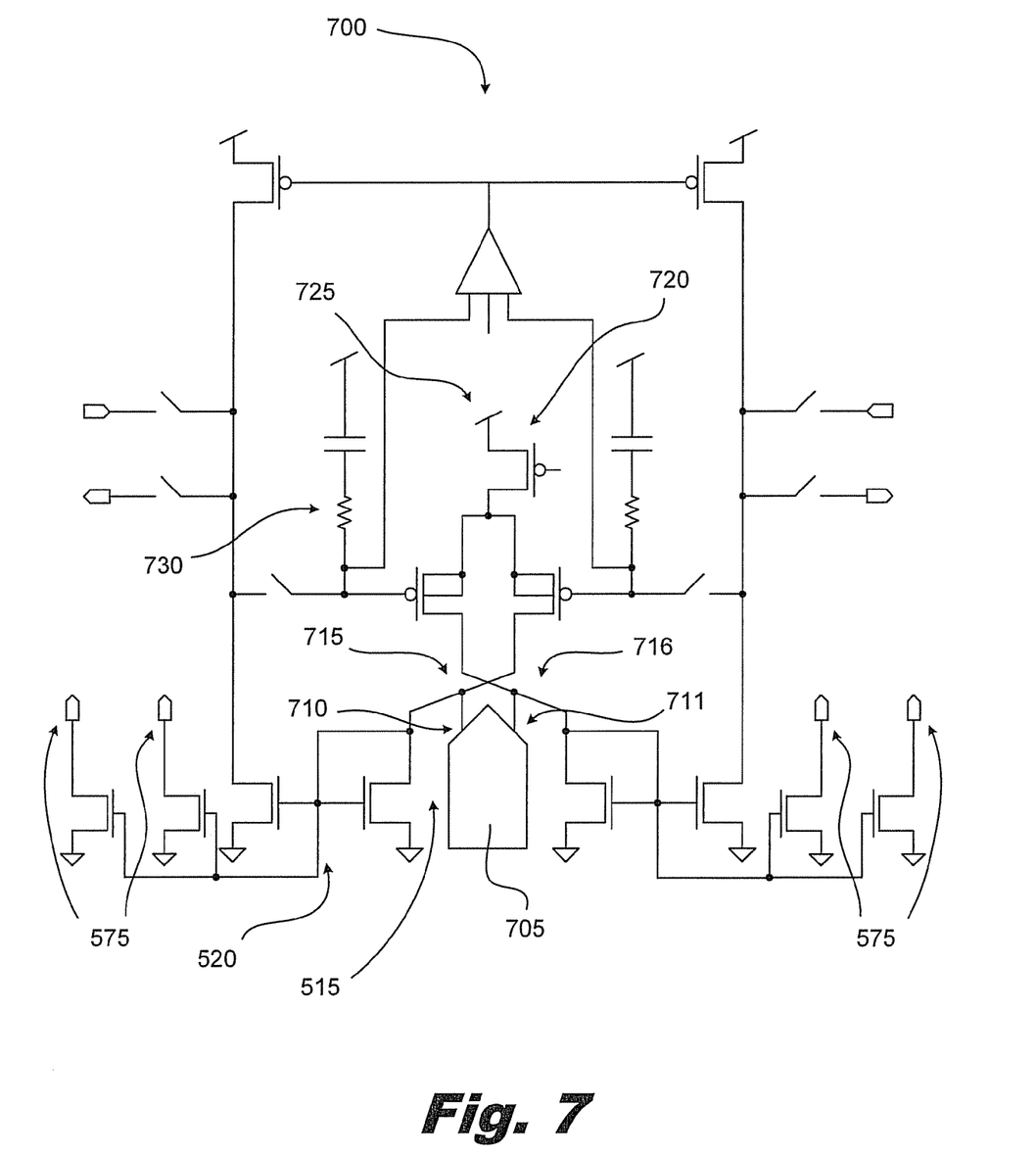
FIG. 7 is a schematic diagram of an illustrative embodiment of a current copier sample and hold circuit, according to principles described herein.

The S/H circuit (700) may include a means for adjusting the current in either side of the circuit to correct for differences in component characteristics, as illustrated in the embodiment of FIG. 7. Ideally, the devices used for the S/H circuit (700) have exact characteristic matches with other devices of the same type and specification. For example, each NMOS transistor in the current mirrors (520) should have identical characteristics to the other NMOS transistors. However, in practice it is difficult to get exact matches between circuit devices, such as transistors, in integrated circuits due to the fabrication processes used to create them. Transistor parameters such as threshold voltage and beta (β) value are often characteristics in which the variance between transistors occurs. Gate oxide thickness plays a large part in device mismatch, particularly due to the inexact nature of growing oxide on a wafer. Variations in etching and ion implantation also cause errors in device mismatch.

The S/H circuit (700) in FIG. 7 has a DAC (705) attached to the crossover (515) of the circuit (700). The DAC (705) has two inputs (710, 711), a first input (710) attached to a first branch (715) of the crossover (515) and a second input (711) attached to a second branch (716) of the crossover (515). The DAC (705) is configured to adjust for current mismatches between the first and second branches (715, 716), such that if the current in the first branch (715) is higher than the current in the second branch (716), the DAC (705) will draw sufficient current from the first branch (715) such that the remaining current in the two branches is identical. Likewise, if the current in the second branch (716) is higher than the current in the first branch (715), the DAC (705) will draw sufficient current from the second branch (716) such that the remaining current in the two branches is identical.

A single PMOS transistor (720) may be used to create a bias current source in some embodiments, where the source of the transistor is tied to a supply voltage (725). The S/H circuit (700) may also include as many or as few transistors or other cascode devices as required by the circuit to provide an accurate current match between the sampling and holding states of the circuit. The S/H circuit (700) may include resistors (730) or other components that may be used in conjunction with capacitors in order to improve performance characteristics of the circuit. The resistors (730) may help the transistor gate voltage charge faster for quicker response, though the resistors (730) should be chosen such that they do not interfere too much with the signal to noise ratio.

Figure 8:
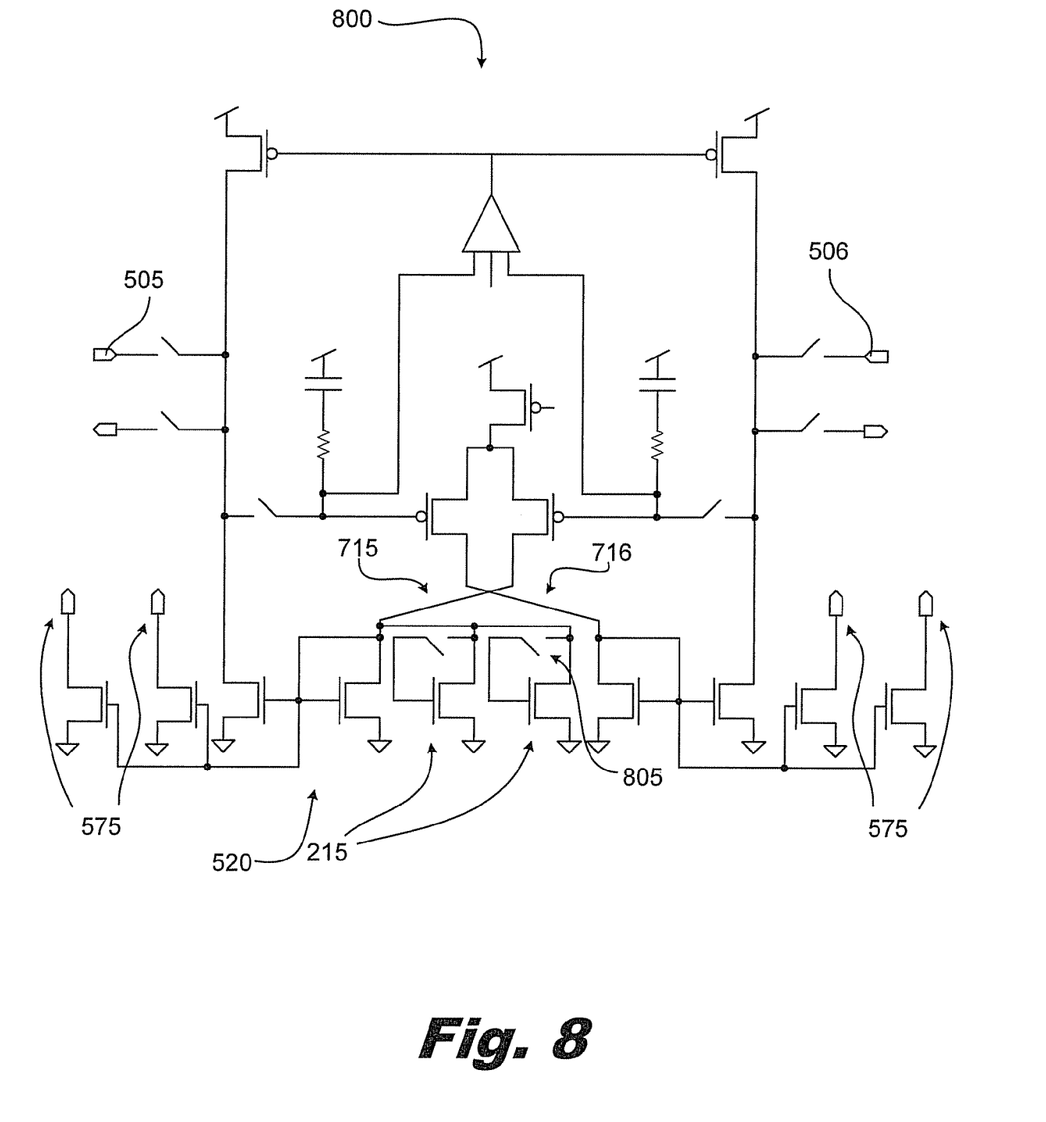
FIG. 8 is a schematic diagram of an illustrative embodiment of a current copier sample and hold circuit, according to principles described herein.

FIG. 8 shows an alternative embodiment of a S/H circuit (800) with a means for correcting for differences in device characteristics. A first branch (715) of the crossover (515) of the S/H circuit (800) may be connected to a number of diode connected transistors (215) in parallel with a current mirror (520). Diode connected transistors (215) in parallel with the current mirror (520) are configured to adjust the characteristics of the first branch (715) of the crossover (515) to match the characteristics of the second branch (716) of the crossover (515). As many or as few diode connected transistors (215) may be connected in parallel with the current mirror (520) as are needed to match the characteristics of the first and second branches (715, 716) of the crossover (515). The diode connected transistors (215) may have switches (805) such that when the switches (805) are closed, the diode connected transistors (215) are able to conduct current from the inputs (505, 506) when the S/H circuit (800) is in a sampling state, and when the switches (805) are opened and the S/H circuit (800) is in a holding state, the transistors (215) are held at a steady current.

Figure 9:
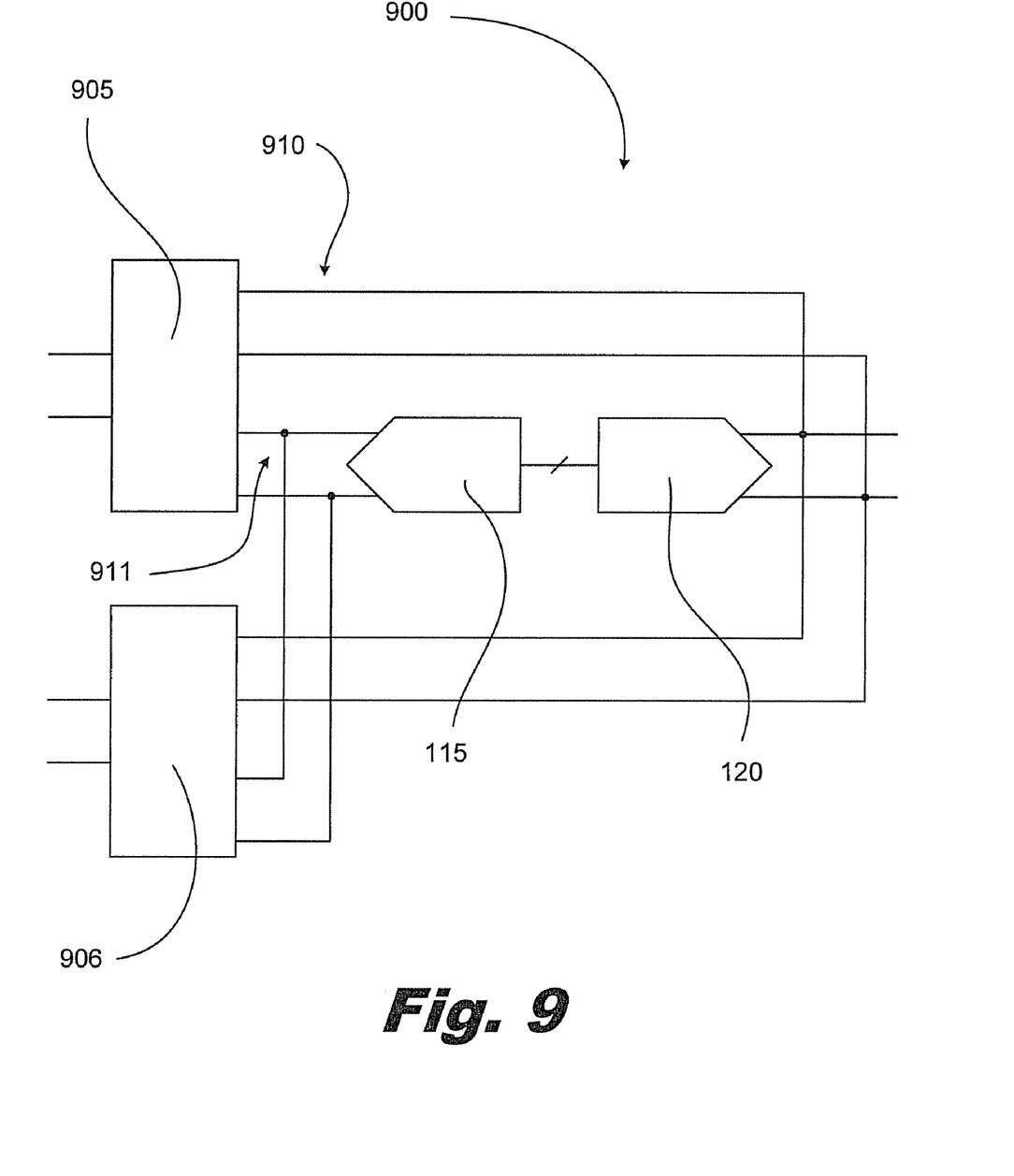
FIG. 9 is a block diagram of an illustrative embodiment of a stage of a pipelined analog-to-digital converter having a number of sample and hold circuits, according to principles described herein.

FIG. 9 shows an illustrative embodiment of an advantageous current mode pipelined ADC stage (900). The stage has first and second S/H circuits (905, 906) that are connected to the input of the flash ADC (115) and the output of the DAC (120). The S/H circuits (905, 906) are in parallel, as viewed by the ADC (115). The S/H circuits (905, 906) may have inputs from a single source, or they may have different sources. Two S/H circuits may allow the stage to process signals faster. Each S/H circuit (905, 906) has first and second outputs (910, 911). The first output (910) is an output from a current copier in each of the S/H circuits (905, 906) and is tied to the output of the DAC (120) for subtraction, while the second output (911) is an output from a current mirror in each of the S/H circuits (905, 906) and is tied to the input of the ADC (115). The two outputs (910, 911) from the two S/H circuits (905, 906) allow the stage (900) to both sample and hold at the same time.

The first S/H circuit (905) may sample a first analog signal and then hold the signal while the signal is processed by the flash ADC (115) and the DAC (120). While the first S/H circuit (905) holds the first signal, the second S/H circuit (906) may sample a second analog signal, either from a previous stage or from another source. Also, as the second S/H circuit (906) holds, the first (current copier) output (910) of the first S/H circuit (905) stops conducting current, since it is now sampling the input, so current flows through the first output (910) of the second S/H circuit (910), allowing the current to still be subtracted from the DAC (120) output. The output of the current mirrors in each S/H circuit (905, 906) does not change while the circuits are in holding mode. Switches between the sample and hold current mirror outputs and the ADC (115) may be included in order to provide the appropriate signal to the ADC (115) for the ADC (115) to sample at the right time.

After the ADC (115) finishes processing the first signal, the second S/H circuit (906) holds the second signal while the ADC (115) reads the second (current mirror) output (911) and the stage (900) then processes the second signal, and the first S/H circuit (905) may sample a next signal. In this manner, the stage (900) may more quickly process signals and more efficiently use the flash ADC (115) and DAC (120). Each stage in the current mode pipelined ADC may have two S/H circuits for quicker and more efficient processing of analog signals in the pipelined ADC.

Configuring the current mode pipelined ADC in such a manner allows the system to process twice as many signals, while adding a minimal amount of circuitry to the system. In the current embodiment, the only added circuitry is an additional S/H circuit. Other systems of the prior art that attempted to process the signals twice as fast may have had to use two flash ADCs (115) and two DACs (120), as well as two sample and holds, in order to achieve the same result. Therefore current embodiment—which includes two S/H circuits and only one ADC and DAC—is more energy efficient than a system that has a number of ADCs and DACs.

The preceding description has been presented only to illustrate and describe embodiments and examples of the principles described. This description is not intended to be exhaustive or to limit these principles to any precise form disclosed. Many modifications and variations are possible in light of the above teaching.

What is claimed is:

1. A pipelined current mode analog-to-digital converter, comprising:
 a plurality of stages each comprising:
 a first sample and hold circuit configured to receive an analog signal having a current;
 said sample and hold circuit having at least first and second outputs;
 said first output comprising a current from a current copier configured to copy said analog signal;
 said second output comprising a current from a current mirror configured to mirror said analog signal;
 a current mode analog-to-digital converter configured to create a digital signal from said second output of said sample and hold circuit; and
 a current mode digital-to-analog converter configured to convert said digital signal back to an analog signal, wherein an output of said digital-to-analog converter is subtracted from said first output of said sample and hold circuit.

2. The pipelined analog-to-digital converter of claim 1, wherein said sample and hold circuit is a differential circuit.

3. The pipelined analog-to digital converter of claim 1, wherein each of said plurality of stages further comprises a second sample and hold circuit connected in parallel with said first sample and hold circuit.

4. The pipelined analog-to digital converter of claim 3, wherein said second sample and hold circuit comprises a first output connected to said digital-to-analog converter output, and a second output connected to said analog-to-digital converter input.

5. The pipelined analog-to digital converter of claim 1, wherein said sample and hold circuit comprises a means for maintaining a voltage of said first output within a predetermined range of values.

6. The pipelined analog-to digital converter of claim 5, wherein said means is a common mode amplifier.

7. The pipelined analog-to-digital converter of claim 6, wherein said voltage at said first output is maintained substantially equal to a reference voltage of said common mode amplifier.

8. The pipelined analog-to-digital converter of claim 1, wherein a first stage of said pipelined analog-to-digital converter comprises a voltage-to-current converter at a beginning of said first stage, configured to convert an analog signal having a voltage to an analog signal having a current.

9. The pipelined analog-to-digital converter of claim 8, wherein said sample and hold circuit is also configured to act as said voltage-to-current converter.

10. The pipelined analog-to-digital converter of claim 1, wherein said current from said current mirror is scaled differently from said analog input.

11. The pipelined analog-to-digital converter of claim 1, wherein said sample and hold circuit comprises a means for adjusting current through first and second branches of said sample and hold circuit.

12. The pipelined analog-to-digital converter of claim 11, wherein said means for adjusting current comprises a digital-to-analog converter.

13. The pipelined analog-to-digital converter of claim 12, wherein said digital-to-analog converter comprises at least one additional transistor connected to at least one of said first and second branches.

14. The pipelined analog-to-digital converter of claim 13, wherein said additional transistor is a diode connected transistor comprising a switch at a gate of said additional transistor.

15. The pipelined analog-to-digital converter of claim 1, wherein said sample and hold circuit comprises at least one scaled output.

16. The pipelined analog-to-digital converter of claim 1, wherein said sample and hold circuit comprises at least one resistor in series with a capacitor at a transistor gate in order to decrease a charge time of said transistor gate.

17. The pipelined analog-to-digital converter of claim 1, wherein said first sample and hold circuit further comprises a third output, said third output being a current from a second current mirror configured to mirror said analog signal.

18. A pipelined current mode analog-to-digital converter stage, comprising:
 first and second parallel sample and hold circuits configured to receive an analog signal having a current;
 said first and second sample and hold circuits each comprising at least first and second outputs, said first output being a current from a current copier and said second output being a current from a current mirror; and
 a current mode analog-to-digital converter configured to alternately output a digital signal of said second output of said first and second sample and hold circuits;
 a current mode digital-to-analog converter to convert said digital signal to an analog signal,
 wherein an output of said digital-to-analog converter is connected to said first output of each of said first and second sample and hold circuits.

19. The pipelined analog-to-digital converter stage of claim 18, wherein said sample and hold circuit is a fully differential circuit.

20. A method for converting an analog signal to a digital signal, comprising:
- sampling and holding an analog signal having a current using at least one current mode sample and hold circuit;
- outputting a first output of said analog signal from a current copier of said at least one sample and hold circuit, and a second output of said analog signal from a current mirror of said at least one sample and hold circuit;
- converting said second output to a digital signal using a current mode analog-to-digital converter;
- converting said digital signal back to an analog signal using a current mode digital-to-analog converter; and
- subtracting an output of said digital-to-analog converter from said first output.

* * * * *